(12) United States Patent
Feldotte et al.

(10) Patent No.: US 10,393,569 B2
(45) Date of Patent: Aug. 27, 2019

(54) WEIGHING APPARATUS WITH PROXIMITY SENSOR

(71) Applicant: SARTORIUS LAB INSTRUMENTS GMBH & CO. KG, Goettingen (DE)

(72) Inventors: Heinrich Feldotte, Goettingen (DE); Manuel Juenemann, Goettingen (DE); Malte Staender, Heiligenstadt (DE)

(73) Assignee: SARTORIUS LAB INSTRUMENTS GMBH & CO. KG, Goettingen (DE)

( * ) Notice: Subject to any disclaimer, the term of this patent is extended or adjusted under 35 U.S.C. 154(b) by 0 days.

(21) Appl. No.: 15/821,175

(22) Filed: Nov. 22, 2017

(65) Prior Publication Data
US 2018/0106665 A1    Apr. 19, 2018

Related U.S. Application Data

(63) Continuation of application No. PCT/EP2016/000588, filed on Apr. 9, 2016.

(30) Foreign Application Priority Data

May 22, 2015   (DE) .................. 10 2015 108 102

(51) Int. Cl.
*G01G 21/28*    (2006.01)
*G01G 21/30*    (2006.01)
(Continued)

(52) U.S. Cl.
CPC .......... *G01G 21/286* (2013.01); *G01G 21/22* (2013.01); *G01G 21/30* (2013.01); *G01S 7/493* (2013.01);
(Continued)

(58) Field of Classification Search
CPC ...... G01G 21/286; G01G 21/22; G01G 21/30; G01S 7/493; G01S 7/536; G01S 15/58;
(Continued)

(56) References Cited

U.S. PATENT DOCUMENTS 4,789,034 A * 12/1988 Luchinger ............ G01G 21/283
                                                                    177/181
5,058,692 A * 10/1991 Melcher ............... G01G 21/286
                                                                    177/181
(Continued)

FOREIGN PATENT DOCUMENTS

DE     20304465 U1    8/2003
DE     20316286 U1    1/2004
(Continued)

OTHER PUBLICATIONS

International Preliminary Report on Patentability and Written Opinion in counterpart International Application No. PCT/EP2016/000588, dated May 17, 2017, 13 pages.
(Continued)

*Primary Examiner* — Randy W Gibson
(74) *Attorney, Agent, or Firm* — Edell, Shapiro & Finnan, LLC (57) ABSTRACT

A weighing apparatus includes —a sample holder (20), —a protective housing (14, 16, 18) with an access port (181) and a closure element (26), —a reflection sensor (34) with a radiation emitter (37) emitting sensor radiation (38) reflected by a reflecting object (39) and with a radiation receiver (42) receiving a sensor radiation component (40), reflected by the object and —a control unit (32), connected to a motorized drive (30) of the closure element and to the reflection sensor, and which controls the motorized drive with a reflection sensor signal, for transferring the closure element between closed and open positions. A differentiating element subjects a sensor primary signal (52) of the reflection sensor to a differentiation. The primary signal depends on a reflection intensity of the reflected radiation component and generates a sensor secondary signal (60). The control unit controls the motorized drive based on the sign of the secondary signal.

13 Claims, 4 Drawing Sheets

(51) Int. Cl.

| | |
|---|---|
| *G01S 15/58* | (2006.01) |
| *G01S 17/58* | (2006.01) |
| *G01S 17/88* | (2006.01) |
| *G01S 7/493* | (2006.01) |
| *G01S 7/536* | (2006.01) |
| *G01S 15/88* | (2006.01) |
| *G01G 21/22* | (2006.01) |
| *G01S 17/50* | (2006.01) |
| G01S 17/48 | (2006.01) |
| G01S 17/87 | (2006.01) |
| G01S 15/46 | (2006.01) |
| G01S 15/87 | (2006.01) |

(52) U.S. Cl.
CPC .............. *G01S 7/536* (2013.01); *G01S 15/58* (2013.01); *G01S 15/88* (2013.01); *G01S 17/50* (2013.01); *G01S 17/58* (2013.01); *G01S 17/88* (2013.01); G01S 15/46 (2013.01); G01S 15/87 (2013.01); G01S 17/48 (2013.01); G01S 17/87 (2013.01); *H03K 2217/94108* (2013.01)

(58) Field of Classification Search
CPC .......... G01S 15/88; G01S 17/50; G01S 17/58; G01S 17/88; G01S 15/46; G01S 15/87; G01S 17/48; G01S 17/87; H03K 2217/94108
See application file for complete search history.

(56) References Cited

U.S. PATENT DOCUMENTS

| | | | | |
|---|---|---|---|---|
| 5,152,356 | A | * | 10/1992 | Strickler ................ G01G 21/28 177/180 |
| 2003/0001756 | A1 | | 1/2003 | Reime |
| 2006/0231298 | A1 | | 10/2006 | Luechinger et al. |
| 2008/0239325 | A1 | | 10/2008 | Cheng et al. |
| 2008/0290929 | A1 | * | 11/2008 | O'Dowd .............. H03K 17/945 327/517 |
| 2013/0154724 | A1 | * | 6/2013 | Smith .................... H03K 5/159 327/551 |
| 2014/0110583 | A1 | * | 4/2014 | Wu ....................... G01S 17/026 250/340 |
| 2018/0323783 | A1 | * | 11/2018 | Bang ...................... G01S 15/04 |

FOREIGN PATENT DOCUMENTS

| | | |
|---|---|---|
| EP | 0216035 A2 | 4/1987 |
| EP | 1715312 A1 | 10/2006 |
| WO | 0154277 A1 | 7/2001 |
| WO | 2009006306 A1 | 1/2009 |

OTHER PUBLICATIONS

International Search Report in counterpart International Application No. PCT/EP2016/000588, dated Jun. 23, 2016, 5 pages.

* cited by examiner

WEIGHING APPARATUS WITH PROXIMITY SENSOR

CROSS-REFERENCE TO RELATED APPLICATIONS

This is a Continuation of International Application PCT/EP2016/000588, which has an international filing date of Apr. 9, 2016, and the disclosure of which is incorporated in its entirety into the present Continuation by reference. The following disclosure is also based on and claims the benefit of and priority under 35 U.S.C. § 119(a) to German Patent Application No. DE 10 2015 108 102.4, filed on May 22, 2015. The content of the patent application DE 10 2015 108 102.4 is also incorporated herein in its entirety.

FIELD OF THE INVENTION

The invention relates to a weighing apparatus, comprising
a sample holder,
a protective housing, which surrounds the sample holder and has an access port and a closure element, which closes the access port into the closed position thereof and releases the access port into the open position thereof,
a reflection sensor with a radiation emitter for emitting sensor radiation, which can be reflected by a reflecting object, and with a radiation receiver for receiving a sensor radiation component reflected by the reflecting object and
a control unit, which is connected to a motorized drive of the closure element and to the reflection sensor and which is designed to control the motorized drive, as a function of a signal of the reflection sensor, for transferring the closure element between the closed and open positions thereof.
Weighing apparatuses of this type are known from EP 0 216 035 A2.

BACKGROUND

Weighing apparatuses, in particular, electronic weighing apparatuses are used in a variety of different fields. One important field of application is the so-called pipette calibration. During the pipette calibration process a sample vessel is positioned on the sample holder of a weighing apparatus and filled step by step via a pipette, wherein the fill quantity of each filling step is measured gravimetrically and is compared with the corresponding nominal values of the pipette, so that the accuracy of the pipette can be checked or, more specifically, adjusted. In order to fill the sample vessel, it is absolutely necessary that the pipette enters into the weighing chamber at least in certain regions. On the other hand, it is necessary to protect the weighing chamber from external interferences. In particular, air flows and temperature variations can distort the weighing result. These problems that are known from conventional electronic balances are usually solved with a closed, so-called draft shield, a weighing chamber floor and a weighing chamber lid, i.e., with a protective housing that completely surrounds the weighing chamber. In order to position and manipulate the sample to be weighed, it is also known to design at least one wall of the protective housing in such a way that it can be opened and closed, as required. The problem of accessibility of the weighing chamber becomes more critical for pipette calibration stations, i.e., for weighing apparatuses specialized for the pipette calibration process, due to the fact that the conventional procedures for calibrating a pipette require that a very large number of filling operations of the sample vessel be carried out in succession in a very short period of time. To open an entire wall, for example, to open a section of the draft shield for this purpose, would be associated with excessive disturbances of the atmosphere in the weighing chamber.

In EP 1 715 312 B1 it is proposed to provide a small opening in a wall of the draft shield that is just large enough to guide a pipette or any other manipulation tool to the sample vessel on the sample holder. This opening in the known apparatus can be closed or is to be opened with a movable closure element, which may be in the form of a slider, a flap or an iris. The published document also mentions in passing the possibility of a motorized drive of the closure element, so that the provision of a control unit for controlling the motor is also implicitly disclosed. However, the inconvenient requirement that the operator has to initiate a command to open or close the closure element for each pipetting operation is a problem.

It is known from DE 203 16 286 U1 to provide for this purpose a non-contact switch in the form of a light barrier. However, it has the disadvantage that the operator is forced to always execute the same sequence of motions during the pipetting operation, i.e., in particular, the passing through the light barrier. For extensive pipetting operations this may be ergonomically stressful.

DE 203 04 465 U1 discloses an analytical balance that has a draft shield with motor-driven wall elements, wherein the motor is controllable by way of an antenna for querying a transponder. In this case it is necessary that the respective transponders be attached to the samples to be weighed or to the sample containers.

Therefore, the aforementioned generic document provides to use a reflection sensor, for example, an infrared or ultrasonic sensor, with a sensitivity range having defined limits and to couple this reflection sensor to the control unit in such a way that the entry of an object, such as, for example, the tip of a pipette, into the sensitivity range causes an opening and a removal of the object from the sensitivity range and a closing of the closure element. Since the reflective properties of different objects vary per se and also as a function of their orientation and motion, the sensitivity range of the sensor that is relevant for the closing or opening is not clearly defined. This can lead to a faulty actuation of the closure element. There is a distinct learning curve before the operator is able to develop a feel for the motions that can be performed without thereby activating the sensor or the motions that have to be performed so that the sensor is activated. However, the possible or rather necessary motions and the body postures are not perceived by all operators to be ergonomically comfortable over long periods of time. In addition, the extent of the sensitivity range may also change due to aging or fouling of the sensor components.

SUMMARY

An object of the present invention is to develop a generic weighing apparatus in such a way that the actuation of the closure elements can be better adapted to the individual sequences of motion of the operating personnel and also independently of the effects of aging and fouling.

This object is achieved, according to one formulation, in that a differentiating element is provided that subjects a sensor primary signal of the reflection sensor to a differentiation. This sensor primary signal depends on a reflection intensity of the reflected sensor radiation component, for generating a sensor secondary signal; and the control unit is designed to control the motorized drive as a function of the sign of the sensor secondary signal.

Exemplary embodiments are also disclosed and claimed in dependent claims hereinbelow.

According to one aspect of the invention, use is made of the signal of the reflection sensor that is known, in principle. The inventive control makes out of the proximity sensor, which was known per se prior to the filing date, a motion direction sensor, which is capable of distinguishing an approaching object from a receding object. This distinction relates not only to the direction of motion, but also to a certain degree to the speed of motion. Basically the differentiating element calculates mathematically the first time derivative of the reflection intensity, detected by the reflection sensor, or a variable that is functionally equivalent thereto. In other words, the variation of the reflection intensity is measured over time. The inventors have recognized that this would enable the user to draw conclusions about the direction of motion of the reflecting object. If, for example, the reflection intensity increases, then theoretically this may, indeed, be due to a number of reasons that cause, for example, the increase in the reflectivity of the reflecting object. However, among the typical general conditions, under which the pipette calibration process is usually carried out, in the vast majority of the cases an increase in the reflection intensity is due to a decrease in the distance between the reflecting object and the reflection sensor. Since the latter is installed in such a way that it is securely connected to the device, the conclusion can be drawn that an increase in the measured reflection intensity represents in all probability the reflecting object, in particular, the pipette or, more specifically, the pipette tip, approaching the weighing apparatus. The same applies to the moving away of the pipette or, more specifically, the pipette tip, which is represented in all probability by a decrease in the measured reflection intensity. An increase can be distinguished from a decrease by the sign of the time derivative of the reflection intensity. Which sign in the individual case is to be associated with which direction of motion depends on the specifically implemented method of calculating the time derivative. In strictly mathematical terms a decrease is associated with a negative sign; and an increase is associated with a positive sign. This assignment shall be maintained in the rest of the description below, so that those skilled in the art will recognize that calculation methods with reverse sign assignment are also possible without changing the essence of the invention.

Therefore, in one aspect, the invention provides, first, to differentiate the sensor primary signal that is used directly in the prior art and is dependent on the reflection intensity. The differentiated sensor primary signal is referred to herein as a sensor secondary signal. Furthermore, the invention provides to make the control of the closure element a function of the sign of the sensor secondary signal. In particular, it is provided to make the direction of motion of the closure element a function of the sign of the sensor secondary signal. Expressed more specifically, it is provided to transfer the closure element from its closed position into its open position when the sensor secondary signal has the sign that is associated with the reflecting object moving towards the reflection sensor (and the closure element is located in its closed position) and to transfer the closure element from its open position into its closed position, when the sensor secondary signal has the sign that is associated with the reflecting object moving away from the reflection sensor (and the closure element is located in its open position). In this case it is possible and generally preferred to incorporate a degree of hysteresis into the controller. This means that the change in the motion of the closure element does not occur instantaneously with each reversal of the sign, but rather only if at the same time there is a minimum absolute value of the sensor secondary signal and/or the sensor primary signal. This prevents the closure element from "jittering" due to the noise of the sensor or the downstream electronics.

Aspects of the present invention lead directly to several advantages. On the one hand, the closure element is controlled, "as required". This means that the access port to the weighing chamber is opened only if the user indicates by the approach of the pipette his desire to enter with the pipette into the weighing chamber. On the other hand, the access port is closed only if the user indicates by moving the pipette away that he does not want to enter into the weighing chamber at least not in the immediate future.

An additional advantage of the invention is the adaptability to different situations. In particular, static or quasi static objects, positioned in the sensitivity range of the sensor, are irrelevant for the actuation of the closure element, i.e., harmless, even though these objects reflect the sensor radiation to the radiation receiver. Static or quasi static objects do not induce, in particular, a reversal of the sign of the sensor secondary signal (measurement significant). This applies to both the elements of the apparatus as well as to the body parts of the user, for example, an arm, which is braced in the sensitivity range of the sensor for the sake of convenience, or a face positioned close to the weighing apparatus. An abrupt change in the user's posture will cause the closure element to open or close briefly for no apparent reason. However, after a very short period of time, the new state will be recognized as "static", so that only the typical shuttle motions of the pipette are still relevant for the closure element in terms of its actuation.

A third advantage of the invention is the insensitivity to fouling and aging processes. They usually occur very slowly (compared to the pipette's speeds of motion). Thus, they are recognized as quasi static. That means that they do not result in a relevant reversal of the sign of the sensor secondary signal.

Expediently, the reflection sensor is designed as a digital sensor, with which a digital sensor primary signal can be generated. The generation of a digital sensor primary signal facilitates the subsequent signal processing and analysis and, in addition, is also fault tolerant even over long communication distances. In principle, the invention can also be implemented with analog sensors.

It can be provided that a periodically modulated sensor radiation can be emitted by the radiation emitter; and downstream of the radiation receiver there is connected a demodulator, which is tuned to the modulation frequency of the sensor radiation, for purposes of generating a sensor raw signal. In other words, preference is given to the use of a reflection sensor that works according to the so-called chopper principle. The chopper principle, which is known to those skilled in the art, can be used to significantly increase the signal-to-noise ratio of a sensor. The sensor raw signal, which is generated in this way, can be used directly as a sensor primary signal.

However, it is in some respects more advantageous, if the reflection sensor comprises a first low-pass filter, with which the sensor raw signal can be converted into the sensor primary signal by low-pass filtering. Such a low-pass filtering provides an efficient noise suppression. Those skilled in the art will recognize that such a noise suppression by low-pass filtering is advantageous, irrespective of whether the sensor raw signal was generated according to the chopper principle or not. In the case of raw signals, which are not generated according to the chopper principle and which typically have a smaller signal-to-noise ratio, noise suppression by low-pass filtering appears to be even more essential.

With respect to the concrete embodiment of the differentiating element the person skilled in the art has various options. In one advantageous embodiment it is provided that the differentiating element comprises a second low-pass filter and a subtracting element, which subtracts an unfiltered and a filtered component of the sensor primary signal from each other, with the filtered component being filtered by the second low-pass filter. Fast temporal variations are included in the unfiltered signal component. These temporal variations are eliminated in the low-pass filtered signal component. Therefore, the difference of both signal components that is calculated by the subtracting element represents in essence the fast variations of the signal over time. This corresponds, as explained above, to the goal of showing with the sensor secondary signal precisely these temporal variations of the sensor primary signal. Those skilled in the art will recognize that the term "second low-pass filter" does not necessarily require the presence of the "first low-pass filter", described above. The distinction between "first"/"second" is made here solely for the purpose of making a functional differentiation between low-pass filters that can be employed as an alternative or together.

It is an alternative way of designing the differentiating element, when a delay element is comprised, as well as a subtracting element that subtracts an undelayed and a delayed component of the sensor primary signal from each other, with the delayed component being delayed by the delay element. A delay element can be implemented, for example, in the form of a digital shift register. At a constant signal the difference between delayed and undelayed signal component is zero, with the difference being calculated by the subtracting element. A variation in the signal leads to a non-zero difference. In this case, too, the generated sensor secondary signal represents the variations in the sensor primary signal.

As the person skilled in the art knows, even integrated digital differentiators are available as separate components on the market. Therefore, it is provided in a further development of the invention to use such an integrated digital differentiator as a differentiating element of the invention.

The above description focuses only on a reflection sensor, acting according to the invention, together with an associated differentiating element. However, this is not to be construed in a restrictive sense. The use of a plurality of reflection sensors is also possible and, in particular, in order to actuate not only a single closure element, but also several closure elements, which can be arranged at different positions, in particular, the sides, of the protective housing in order to adapt, for example, to right and left handed users. Thus, for example, it can be provided in a further development of the invention that a plurality of identically acting reflection sensors together with the associated differentiating elements are comprised, each associated with one of the several motor driven closure elements, wherein the control unit is configured to control, as a function of the signal of the reflection sensor that delivers the strongest signal, the motorized drive of its associated closure element. If, therefore, an object is detected simultaneously by several reflection sensors in the detection space and is recognized, for example, as approaching based on the signal processing of the invention, then the signal strength of the sensor primary signal can be used as the decisive criterion for selecting the closure element that is to be opened. This corresponds to a rudimentary triangulation. Of course, a prerequisite is a mapping of the closure elements and the reflection sensors according to the spatial proximity of the closure elements and the detection ranges of the associated reflection sensors.

As an alternative, it is also possible to operate several closure elements with a single reflection sensor, acting according to the invention, with a differentiating element, when additional auxiliary sensors are used that may be designed as motion sensors of any desired design, for example,—but not necessarily—also as reflection sensors. Thus, it is provided in one embodiment that a plurality of motor-driven closure elements are comprised, each being associated with an auxiliary motion sensor, with which a surrounding area, adjacent to the respective closure element, can be monitored for motions of an object, wherein, furthermore, the control unit is configured, as a function of the signal of the reflection sensor, to control the motorized drive of the closure element, whose associated auxiliary motion sensor detects at the same time an object's motion in the associated surrounding area. In this case, too, it is, of course, necessary to have a mapping that is meaningful with respect to the proximity of the closure elements and the auxiliary motion sensors. In this respect the reflection sensor, acting according to the invention, with a differentiating element is responsible for the detection of the direction of motion of the reflecting object, for example, the pipette tip, and, therefore, is responsible for the direction of motion of the closure element to be actuated; the auxiliary motion sensors are used to select the closure element to be actuated.

In the event that the detection ranges of the auxiliary motion sensors overlap, a state that may well be the case in order to avoid "blind spots" in a reliable way, it can be provided in a further development of this embodiment that in the event that several auxiliary motion sensors detect simultaneously an object's motion in their respective associated surrounding area, the control unit is further configured to control, as a function of the signal of the reflection sensor, the motorized drive of that closure element, whose associated auxiliary motion sensor delivers the highest signal level. This also corresponds to a rudimentary triangulation between the auxiliary motion sensors.

Of course, it is also possible to use more sophisticated triangulation methods. If, for example, (but not only then) the number of closure elements exceeds the number of (several) sensors—whether it be a plurality of reflection sensors or a plurality of auxiliary motion sensors—, the direction, in which the reflecting object is located relative to the weighing apparatus or where the object's motion takes place, can be determined by a real triangulation comparison of the signal strengths. Then it is possible to select the closure element, whose position best matches this direction, as the closure element to be actuated. A 1:1 mapping of the closure elements and the sensors is not required in this embodiment. However, in practice such a solution is rarely used due to the high mechanical complexity for a plurality of motor-driven closure elements and the complexity of a reliable (real) triangulation programming. For typical applications with two closure elements (for example, for right and left handed operator control) an implementation with rudimentary triangulation, as described above, ought to be, as a rule, more advantageous.

Other features and advantages of the invention will become apparent from the following specific description and the drawings.

BRIEF DESCRIPTION OF THE DRAWINGS

The drawings show in

DETAILED DESCRIPTION

Identical reference numerals in the figures indicate identical or analogous elements.

Figure 1:
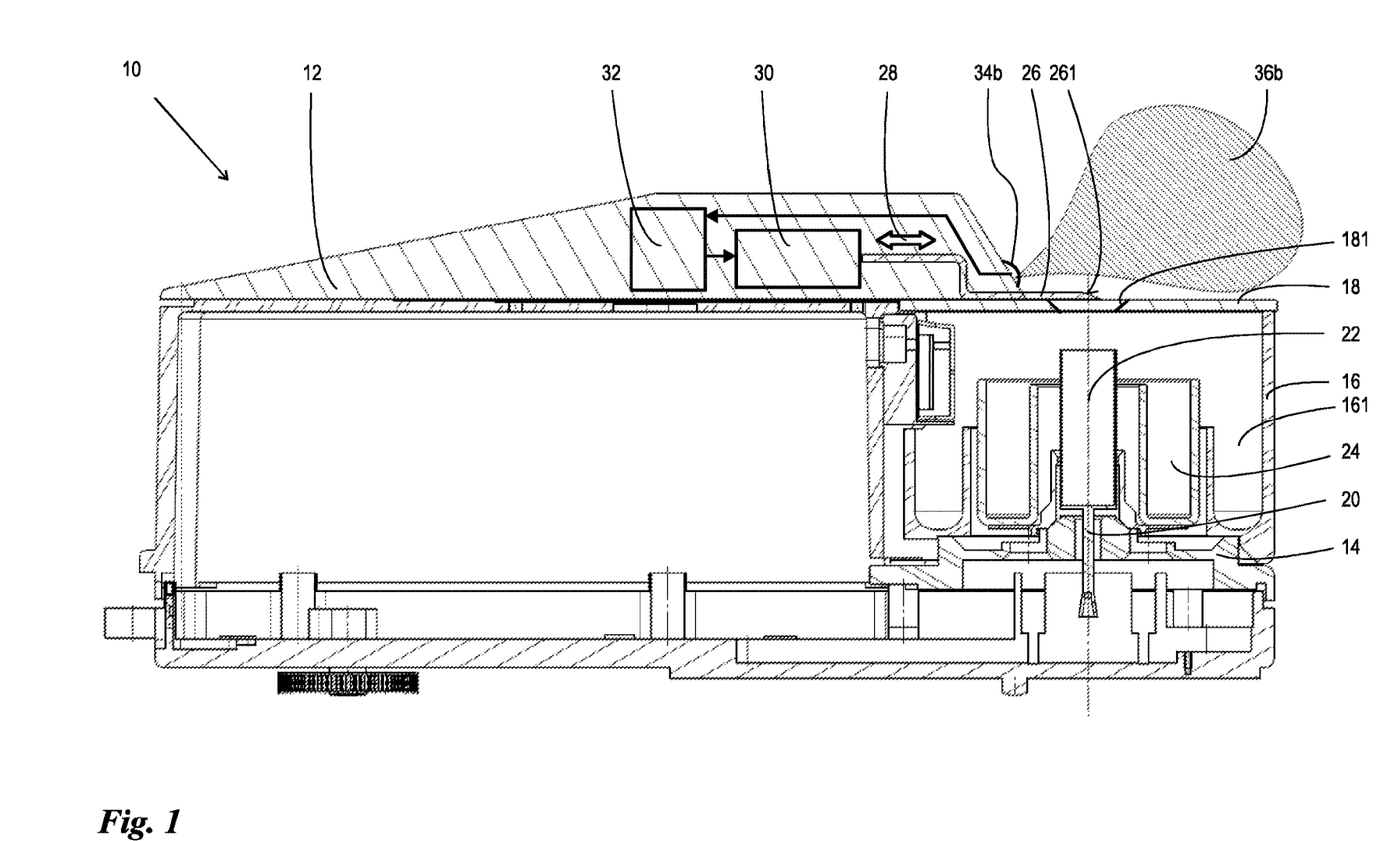
FIG. 1 a reduced representation of a longitudinal section of an embodiment of a weighing apparatus according to the invention.

FIG. 1 shows a reduced representation of a longitudinal section of an exemplary embodiment of a weighing apparatus 10 according to the invention. The representation is reduced in so far as it does not show those elements of the weighing mechanism and weighing electronics that are irrelevant for the present invention. The weighing apparatus 10 comprises a housing 12 having a front end (on the right in FIG. 1), from which a working platform 14 projects. Mounted on the working platform 14 there is a draft shield 16, which is shown separately in a preferred embodiment in FIG. 3 and which will be explained in more detail below. The draft shield 16 forms in essence a circumferential weighing chamber wall, which shields laterally a weighing chamber, located inside, from environmental influences. The floor of the weighing chamber is formed in essence by the working platform 14, which in this function should also be assigned to the weighing chamber wall. Towards the top the weighing chamber is defined by a weighing chamber lid 18, which rests on the upper edge of the draft shield 16. The weighing chamber lid 18 shields the weighing chamber upwards from environmental influences and in this respect should also be assigned to the weighing chamber wall. Inside the weighing chamber there is disposed a sample holder 20, which passes downwards through the weighing chamber floor, i.e., the top side of the working platform 14, and is connected in a manner not shown to the weighing mechanism (not shown) in the interior of the working platform. In FIG. 1 a hollow cylindrical sample vessel 22 sits on the sample holder 20.

The sample vessel 22 is surrounded by a first evaporation trap 24, which is designed in the form of an annular vessel, which runs concentrically around the sample vessel 22 or, more specifically, the sample holder 20. The first evaporation trap 24 is used to receive a liquid, which evaporates when the weighing apparatus 10 is in operation and, thus, keeps the humidity in the weighing chamber at a constant, high level. The constantly high humidity in the weighing chamber counteracts the evaporation of liquid in the sample vessel 22, an aspect that is important, in particular, when the weighing apparatus 10 is used as a gravimetric pipette calibration station. The first evaporation trap 24 is preferably configured as an easily removable insert.

In the embodiment shown in FIG. 1 there is also provided a second evaporation trap 161, which is formed integrally with the draft shield. As can be seen very clearly from FIGS. 1 and 3 when viewed together, the draft shield 16 is designed so as to be double walled, and an outer cylindrical ring wall 162 and an inner cylindrical ring wall 163 are connected to each other through a ring-shaped floor 164, so that an annular vessel is formed that can be used as the second evaporation trap 161, which has a mode of operation and effect that corresponds to the first evaporation trap 24. Thus, the draft shield 16 fulfills a dual function, i.e., as an actual draft shield and as a second evaporation trap. This embodiment, which is independent of the other features of the invention, in particular, the proximity sensor system, which will be described in more detail below, is particularly advantageous in so far as it makes possible an adaptability to different sizes of sample vessels. When calibrating pipettes of different sizes, it is necessary to fill different quantities of liquid per calibration step into the sample vessel. In this case a large sample vessel is required for large samples. For small sample quantities that could fit, in principle, in a large sample vessel, it is more advantageous to use a small sample vessel for reasons relating to the prevention of evaporation. In addition, the evaporation plays a much greater role as an interference with small sample quantities than with large sample quantities. Therefore, a double evaporation trap can be used, as illustrated in the equipment setup of FIG. 1, with small sample vessels, in order to be able to counteract the evaporation of the sample material in a particularly effective way. For large sample quantities, however, the first evaporation trap 24 can be removed; and the narrow sample vessel 22 can be replaced with a sample vessel of larger diameter, in particular, a diameter that corresponds to that of the first evaporation trap 24.

Figure 3:
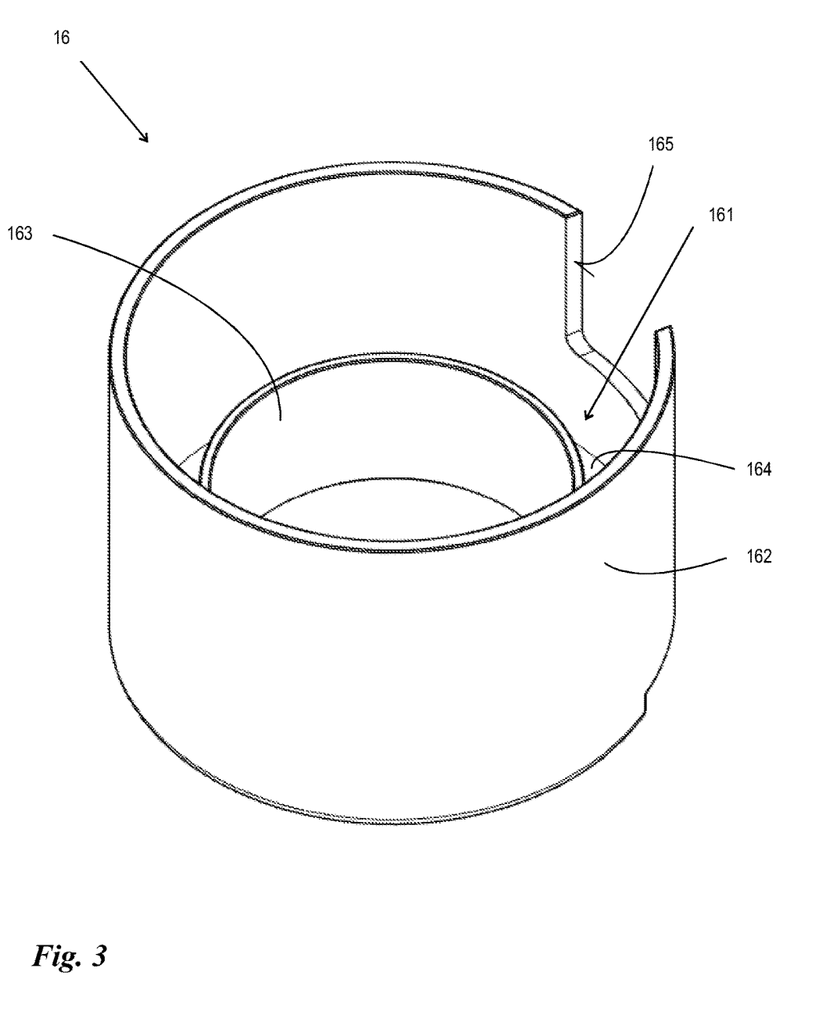
FIG. 3 a perspective view of the draft shield of the weighing apparatus from FIG. 1.

In the illustrated embodiment the wall cutout 165 in the outer wall 162 of the draft shield 16 is used to adapt the draft shield 16 to the housing 12 of the weighing apparatus 10 in a form fitting manner. On the whole, the draft shield 16 is designed preferably as an easily removable insert. This aspect improves, in particular, the cleanability of the weighing apparatus 10. There is the advantageous possibility, which is not shown in the figures, of segmenting the evaporation trap chamber, which is formed between the outer ring wall 162 and the inner ring wall 163, using radial separating elements. In principle, any liquid, stored in the evaporation trap 161, can be used as pipetting liquid during the pipette calibration process. As a result, it is no longer necessary to insert and remove the pipette into or from the weighing chamber in each pipetting step. Owing to the aforementioned segmentation it is possible to store different liquids.

Figure 2:
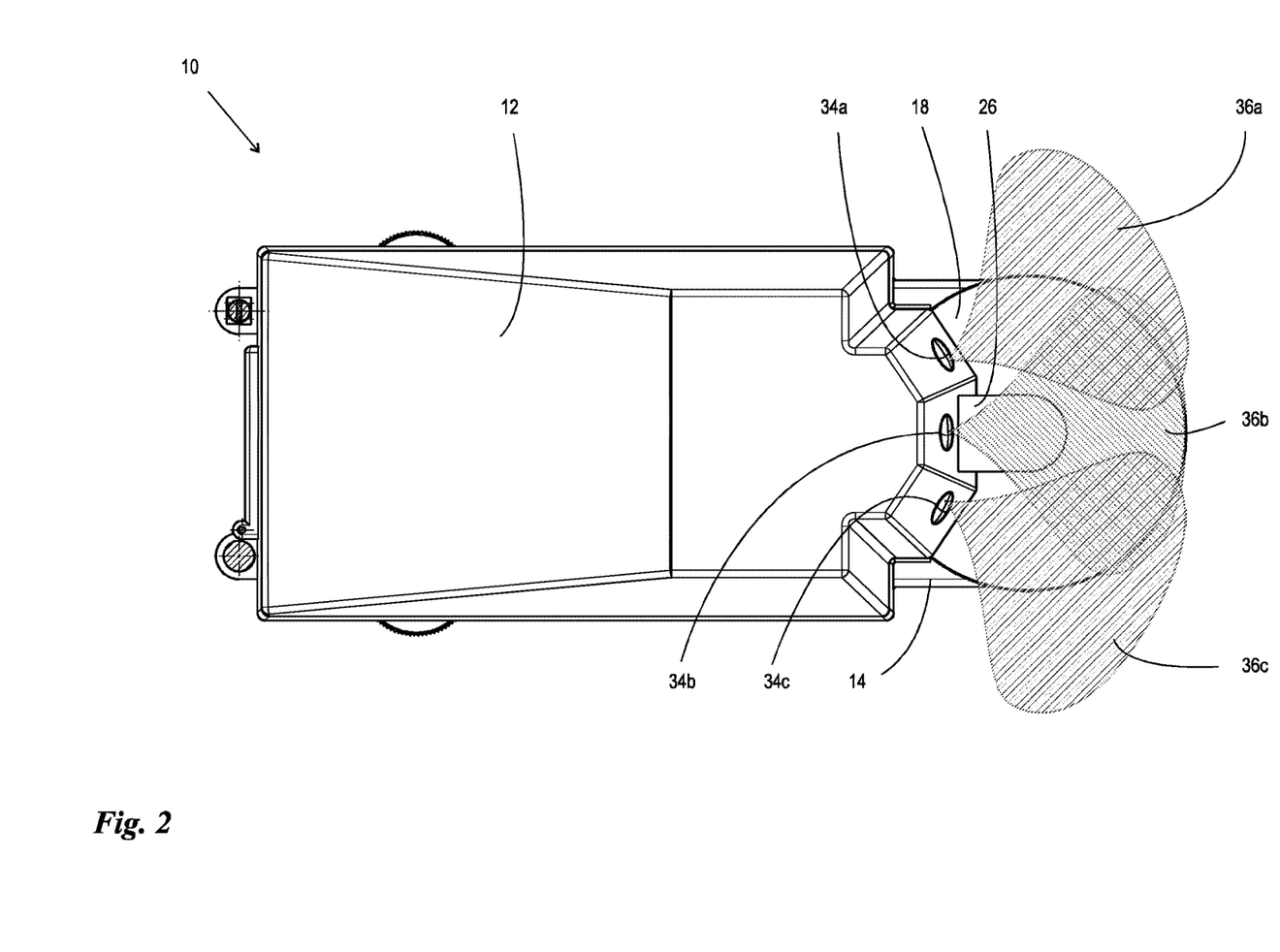
FIG. 2 a plan view of the weighing apparatus from FIG. 1.

As can be seen in FIG. 1, the weighing chamber lid 18 has a central breakthrough 181. This central breakthrough 181 is used as the access port to the weighing chamber, through which during the pipette calibration process the pipette tip can be passed without having had to take off the entire weighing chamber lid 18. The access port 181 can be closed with a closure element 26, which is designed as a slider, which can be shifted parallel to the weighing chamber lid 18 in the embodiment shown in FIG. 1. The ability to shift the slider 26 is indicated by the displacement arrow 28 in FIG. 1. The slider 26 is connected to a motor drive 30 (not shown in detail), which in turn is coupled by way of signal technology to a control unit 32. The control unit 32 in turn is coupled by way of signal technology to a proximity sensor 34$a$, $b$, $c$, with which the approaching and moving away of an (any) object can be detected in a detection space 36$a$, $b$, $c$. As can be seen, in particular, in FIG. 2, the proximity sensor system comprises in the embodiment shown three single reflection sensors 34$a$, 34$b$, 34$c$, each monitoring a subspace 36$a$, 36$b$, 36$c$ of the detection space for the presence of an object. In a generally preferred embodiment the individual sensors 34$a$, 34$b$, 34$c$ are designed as infrared reflection sensors. However, other types of reflection sensors, for example, ultrasonic reflection sensors, can be used just as well, independently of the rest of the design of the weighing apparatus 10. The club-like subspaces (indicated in FIGS. 1 and 2), which together form the detection space 36a, b, c of the proximity sensor system 34a, b, c, are to be construed in a purely illustrative manner. Those skilled in the art will recognize that it is not possible to achieve precisely defined detection space limits using the IR reflection technique or with other possible sensor techniques. This detection space 36a, b, c is configured in such a way that it surrounds (as seen from the direction of the user) the access port 181 in the weighing chamber lid 18, so that it is not possible to either approach (sufficiently fast) or move away from the access port 181 without triggering a signal of the proximity sensor system 34a, b, c. Then such a signal is translated by the control unit 32 into a control signal for the motorized drive 30 of the slider 26, so that when an object approaches the access port 181, the slider automatically retracts and releases the access port 181 or, when the object moves away, the slider automatically advances and closes the access port. During a typical pipette calibration process this object corresponds to the pipette tip.

In FIG. 1 an outwards recessed chamfer of the front edge 261 of the slider 26 can be seen. This chamfer causes the air, which is displaced by the volume of the slider 26 when the slider advances in the direction of closure, to be discharged to the external environment, so that the slider's motion 28 in the weighing chamber cannot induce by itself any undesired fluctuations of the air pressure.

Figure 4:
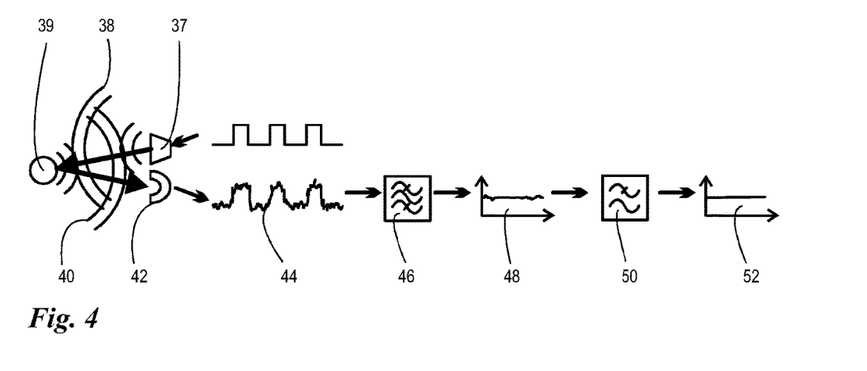
FIG. 4 a schematic representation of an exemplary mode of operation of the reflection sensor.

FIG. 4 shows in a highly schematic representation an exemplary embodiment of the actuation of one of the reflection sensors 34a, 34b, 34c up to the generation of a sensor primary signal 52. As explained above and generally known, a reflection sensor comprises a radiation emitter 37, which is suitable and is intended to emit a predetermined type of radiation, for example, a mechanical wave, such as, for example, an ultrasonic or electromagnetic wave, such as, for example, infrared light. In the embodiment that is shown, the transmission of the sensor radiation 38 is carried out in a periodically modulated manner. The sensor radiation 38 is reflected from a reflecting object 39, for example, a pipette tip, located in the detection space 36a, b, c. The reflected sensor radiation 40 is detected by a radiation receiver 42, which is typically positioned in the immediate vicinity of the radiation emitter 37, i.e., is transformed into a receiver output signal having a signal strength that is typically a function of the received reflection intensity. Owing to the sensor radiation 38, which is emitted in a modulated manner in the exemplary embodiment that is shown, the result is a correspondingly modulated intensity signal 44, which is subjected to a demodulation by a demodulator 46, which may comprise a bandpass filter, so that a demodulated signal with a good signal-to-noise ratio is produced as the sensor raw signal 48. This sensor raw signal can be used directly as a sensor primary signal. However, in the embodiment shown the sensor primary signal is also subjected to the filtering by a first low-pass filter 50, so that a further signal smoothing is carried out that results in a very low-noise sensor primary signal 52. Those skilled in the art will recognize that the described type of control of the reflection sensor according to the so-called "chopper" principle leads to an improvement in the signal quality of the sensor primary signal 52, but is by no means required for the generation thereof. In particular, as an alternative, a non-modulated control of the radiation emitter 37 is also conceivable.

Figure 5:
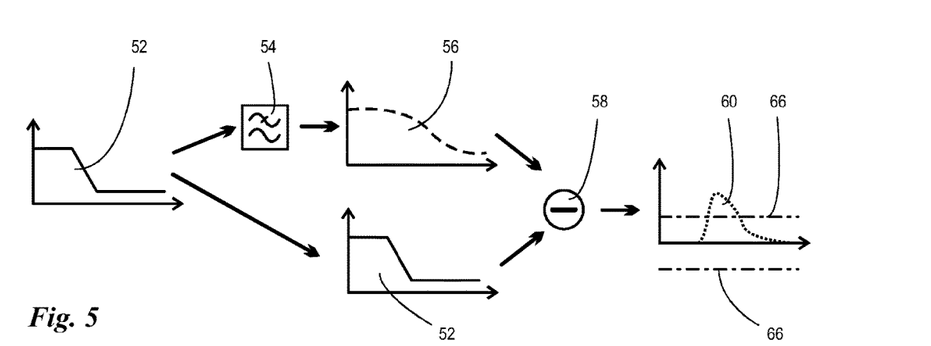
FIG. 5 a schematic representation of a first exemplary form of the generation of the sensor secondary signal.
Figure 6:
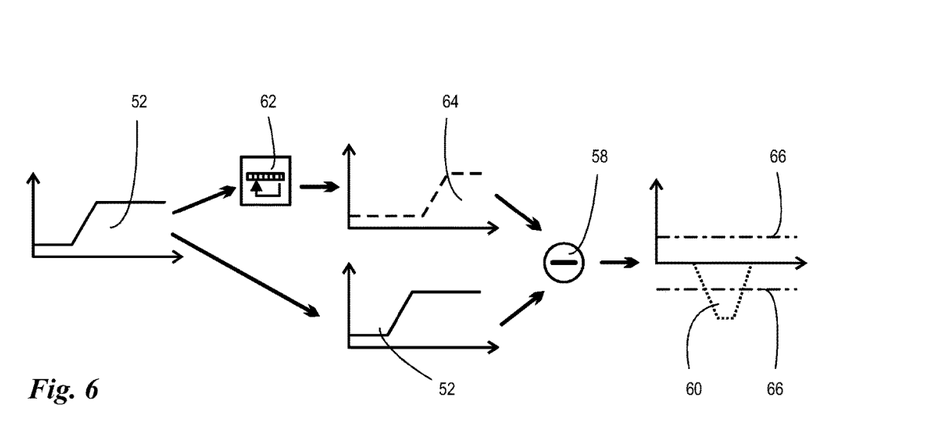
FIG. 6 a schematic representation of a second exemplary form of the generation of the sensor secondary signal.

FIGS. 5 and 6 show two variants for further processing, according to the invention, the sensor primary signal 52, which is generated, preferably, but not necessarily in accordance with the principle of FIG. 4. In any case the sensor primary signal 52 is subjected to a differentiation. In the embodiment from FIG. 5 the differentiation is carried out by low-pass filtering and subtraction. In the embodiment from FIG. 6, the differentiation is carried out by delay and subtraction.

In the embodiment from FIG. 5, the sensor primary signal 52 is partially subjected to the filtering through a low-pass filter 54. The result is a filtered sensor primary signal 56, from which the unfiltered component of the sensor primary signal 52 is subtracted by the subtracting element 58. The result is a sensor secondary signal 60, which basically corresponds to the first time derivative of the sensor primary signal. In the example shown in FIG. 5, the sensor primary signal 52 represents a drop in intensity, which occurs, in particular, when the reflecting object 39 moves away from the reflection sensor. The result is a sensor secondary signal 60, which has a value of zero for the times of the constant sensor primary signal 52 and a value greater than zero during the change in the sensor primary signal 52. Thus, in this case the positive sign indicates a moving away of the reflecting object 39, which could be used as a reason to transfer the closure element from its open position into its closed position.

FIG. 6 shows the reverse case of a rising sensor primary signal 52, an aspect that indicates an approach motion of the reflecting object 39. Accordingly the result is a negative sensor secondary signal 60, so that the negative sign of the sensor secondary signal can be associated with the approach motion of the reflecting object 39. With respect to the special calculation mechanism the embodiment from FIG. 6 differs from that shown in FIG. 5 in that a signal component of the sensor primary signal 52 is not subjected to any low-pass filtering, but rather to a delay by a delay element 62, which may be, for example, a shift register. The result is a delayed sensor primary signal 64, from which is subtracted, comparable to the case shown in FIG. 5, the undelayed sensor primary signal 52 using the subtracting element 58.

In the embodiments in FIGS. 5 and 6, threshold values 66 are shown, which are to be overcome preferably by the sensor secondary signal 60, in order to trigger an activation of the closure element. This results in a hysteresis in the motion of the closure element, and this hysteresis prevents the closure element from jittering in the case of a noisy sensor secondary signal 60. In this way it can also be ensured that only sufficiently fast motions of the reflecting object 39 lead to an actuation of the closure element. Slow motions, the speed of which is significantly below the typical speed of motion during the pipette calibration process, are classified by the system as static or quasi-static and do not lead to undesired closure element actions.

Of course, the embodiments, discussed in the specific description and shown in the figures, represent only illustrative exemplary embodiments of the present invention. The person skilled in the art is given in light of the disclosure herein a broad spectrum of possible variations. In particular, the invention is not restricted to a specific sensor technology or a specific number of individual sensors. It is also not necessary for the invention that the access port 182 be in the weighing chamber lid 18. For example, embodiments with a laterally arranged access port are also conceivable. The applicant seeks to cover all such variations as fall within the spirit and scope of the invention, as defined by the appended claims, and equivalents thereof.

LIST OF REFERENCE NUMERALS 10 weighing apparatus
12 housing 14 working platform
16 draft shield
161 second evaporation trap
162 outer ring wall of 16
163 inner ring annular wall of 16
164 floor between 162 and 163
165 cutout in 162
18 weighing chamber lid
181 access port 18
20 sample holder
22 sample vessel
24 first evaporation trap
26 closure element
28 displacement arrow
30 motorized drive
32 control unit
34a, b, c reflection sensor
36a, b, c detection space
37 radiation emitter
38 sensor radiation
39 reflecting object
40 reflected radiation sensor
42 radiation receiver
44 modulated intensity signal
46 demodulator
48 sensor raw signal
50 first low-pass filter
52 sensor primary signal
54 second low pass filter
56 filtered sensor primary signal
58 subtracting element
60 sensor secondary signal
62 delay element
64 delayed sensor primary signal
66 threshold value

What is claimed is:

1. A weighing apparatus, comprising
a sample holder,
a protective housing, which surrounds the sample holder and has an access port and a closure element, which is configured to close the access port into a closed position and to release the access port into an open position,
a reflection sensor with a radiation emitter, configured to emit sensor radiation directed to be reflected by a reflecting object, and with a radiation receiver, configured to receive a sensor radiation component reflected by the reflecting object,
a motorized drive for the closure element,
a control unit connected to the motorized drive and to the reflection sensor and configured to control the motorized drive in accordance with respective signals of the reflection sensor produced on an approach of the reflecting object, for transferring the closure element from the closed position into the open position, or produced on a retreat of the reflecting object, for transferring the closure element from the open position into the closed position, and
a differentiating element configured to subject a sensor primary signal of the reflection sensor to a differentiation, the sensor primary signal depending on a reflection intensity of the reflected sensor radiation component, and configured to generate a sensor secondary signal;
wherein the control unit controls the motorized drive to transfer the closure element in respective directions of motion, as a function of respective signs of the sensor secondary signal associated with the approach and the retreat of the reflecting object.

2. Weighing apparatus, as claimed in claim 1,
wherein the reflection sensor comprises a digital sensor configured to generate a digital sensor primary signal.

3. Weighing apparatus, as claimed in claim 1,
wherein the radiation emitter is configured to emit a periodically modulated sensor radiation; and
further comprising a demodulator arranged downstream of the radiation receiver, and tuned to the modulation frequency of the sensor radiation, to generate a sensor raw signal.

4. Weighing apparatus, as claimed in claim 1,
wherein the reflection sensor comprises a first low-pass filter configured to convert the sensor radiation component into the sensor primary signal through low-pass filtering to generate a filtered component.

5. Weighing apparatus, as claimed in claim 4,
wherein the differentiating element comprises a second low-pass filter, configured to filter the sensor primary signal, and a subtracting element, configured to subtract an unfiltered component of the sensor primary signal from the filtered component of the sensor primary signal.

6. Weighing apparatus, as claimed in claim 5,
wherein the differentiating element comprises a delay element, configured to delay the sensor primary signal to provide a delayed component, and a subtracting element, configured to subtract an undelayed component of the sensor primary signal from the delayed component of the sensor primary signal.

7. Weighing apparatus, as claimed in claim 2,
wherein the differentiating element is an integrated digital differentiator.

8. Weighing apparatus, as claimed in claim 1,
further comprising at least one additional closure element with at least one additional associated motor drive, at least one additional reflection sensor and at least one additional differentiating element, which, together with the closure element, the reflection sensor and the differentiating element, provide plural motor drives, plural closure elements, plural reflection sensors, and plural differential elements, wherein the control unit is further configured to control a given one of the plural motor drives of a given associated one of the closure elements, whose location best matches a direction of the reflecting object, according to a triangulation comparison of signal strengths of the sensor primary signals of the plural reflection sensors.

9. Weighing apparatus, as claimed in claim 8,
wherein each of the closure elements is assigned to a respective one of the reflection sensors, and wherein the control unit is configured to control the given one of the plural motor drives of the associated one of the closure elements, whose associated reflection sensor delivers a strongest one of the sensor primary signals.

10. Weighing apparatus, as claimed in claim 1,
further comprising at least one additional closure element with at least one additional associated motor drive, which together with the closure element and the motor drive provide plural closure elements and plural motor drives, and further comprising a and a plurality of auxiliary motion sensors, with which respective surrounding areas of the closure elements are monitored for motions of an object,
wherein the control unit is further configured, as a function of the signal of the reflection sensor, to control a given one of the plural closure element, whose location best matches a direction of an object's motion, according to a triangulation comparison of signal levels of the auxiliary motion sensors.

11. Weighing apparatus, as claimed in claim 10, wherein each of the closure elements is assigned to a respective one of the auxiliary motion sensors, and wherein the control unit is further configured to control the given one of the plural motor drives of the associated one of the closure elements, whose associated auxiliary motion sensor detects motion of the object in the associated surrounding area.

12. Weighing apparatus, as claimed in claim 11, wherein the control unit is further configured, in the event that several of the auxiliary motion sensors simultaneously detect motion of the object in their respectively associated surrounding area, to control, as a function of the signal of the reflection sensor, the motor drive of the associated one of the closure elements, whose associated auxiliary motion sensor delivers a highest one of the signal levels.

13. Weighing apparatus, as claimed in claim 1, wherein the differentiating element comprises a delay element, configured to delay the sensor primary signal to provide a delayed component, and a subtracting element configured to subtract an undelayed component of the sensor primary signal from the delayed component of the sensor primary signal.

\* \* \* \* \*